US009008156B1

(12) United States Patent
Dick

(10) Patent No.: US 9,008,156 B1
(45) Date of Patent: Apr. 14, 2015

(54) WAVEFORM DIFFERENTIATING REPEATER

(71) Applicant: Xilinx, Inc., San Jose, CA (US)

(72) Inventor: Christopher H. Dick, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/267,846

(22) Filed: May 1, 2014

(51) Int. Cl.
| H04B 3/36 | (2006.01) |
| H04B 7/17 | (2006.01) |
| H04B 17/02 | (2006.01) |
| H04L 25/20 | (2006.01) |
| H04L 25/52 | (2006.01) |

(52) U.S. Cl.
CPC .................................. H04L 25/20 (2013.01)

(58) Field of Classification Search
USPC .................................. 375/211, 219, 220, 222
See application file for complete search history.

(56) References Cited

U.S. PATENT DOCUMENTS

| 5,544,661 | A * | 8/1996 | Davis et al. ................... 600/513 |
| 2008/0045161 | A1 * | 2/2008 | Lee et al. ........................ 455/73 |
| 2008/0262732 | A1 * | 10/2008 | Davis et al. ....................... 702/4 |
| 2012/0108999 | A1 * | 5/2012 | Leininger et al. .............. 600/546 |

OTHER PUBLICATIONS

TechTarget, http://searchnetworking.techtarget.com/definition/repeater, published Sep. 2005.*
Al-Habashna, A. et al., "Second-order cyclostationary of mobile WiMAX and LTE OFDM signals and application to spectrum awareness in cognitive radio systems," IEEE J. of Selected topics in signal processing, vol. 6, No. 1, Feb. 2012, pp. 26-42.
Junjie, P., et al., "A detection method of WCDMA signal based on quadratic fourth-order moment chip at lower SNR", Wireless Communications, Networking and Mobile Computing, WiCom '09, Sep. 24-26, 2009, pp. 1-4.

* cited by examiner

Primary Examiner — Ted Wang
(74) Attorney, Agent, or Firm — W. Eric Webostad

(57) ABSTRACT

An apparatus relates generally to a repeater. In such an apparatus, the repeater has a signal analysis and classification block. The signal analysis and classification block includes a signal analysis block and a classification block. The signal analysis block is coupled to receive a digital signal which is a digital version of an input signal received by the repeater. The signal analysis block is coupled to provide signal information regarding the digital signal to the classification block. The classification block is configured to provide classification information to classify the digital signal using the signal information provided as being a waveform type of a group of waveform types.

19 Claims, 7 Drawing Sheets

WAVEFORM DIFFERENTIATING REPEATER

FIELD OF THE INVENTION

The following description relates to integrated circuit devices ("ICs"). More particularly, the following description relates to a waveform differentiating repeater for an IC.

BACKGROUND

A basestation may be coupled to another basestation or one or more user devices though a repeater. A conventional repeater accepts an incoming communication waveform and re-amplifies such incoming waveform as received. This type of repeater may be referred to as an "amplify-and-forward" repeater. Another type of repeater may digitize a received signal, process such received signal for amplification, and then re-amplify such signal for retransmission. However, conventionally such repeaters have processed all incoming signals without any deference with respect to the type of waveform received. However, there may be many types of wireless communication waveforms for a plurality of air interface protocols. Examples of waveform types include OFDM (such as for LTE or WiMax for example), spread spectrum (such as for WCDMA, TD-SCDMA or CDMA2000 for example), frequency hopping or static narrow band signals (such as for frequency hopping or static GSM, respectively, for example), or a combination thereof, among other types of waveforms or other air interface protocols. Thus, communication waveforms may have been retransmitted with such conventional repeaters without regard to type ("blind processing") leading to a significantly diminished waveform than that originally transmitted by a basestation. Such "blind processing" of a signal may mean that one or more associated signal processing algorithms may not be used. As such such one or more algorithms may have a capability to improve power efficiency, such as of a power amplifier for example, and/or enhance quality or robustness of a communication link between a repeater/relay and a basestation, an inability to apply such one or more signal processing algorithms may in effect increase operational expenditures.

Hence, it would be desirable to provide a repeater that provides some differentiation with respect to a type of waveform received for pre-processing for retransmission to enhance quality of such retransmitted waveform.

SUMMARY

An apparatus relates generally to a repeater. In such an apparatus, the repeater has a signal analysis and classification block. The signal analysis and classification block includes a signal analysis block and a classification block. The signal analysis block is coupled to receive a digital signal which is a digital version of an input signal received by the repeater. The signal analysis block is coupled to provide signal information regarding the digital signal to the classification block. The classification block is configured to provide classification information to classify the digital signal using the signal information provided as being a waveform type of a group of waveform types.

A method relates generally to operation of a repeater. In such a method, an input signal is received by the repeater. The repeater includes an input processing chain coupled to a signal analysis and classification block. The signal analysis and classification block includes a signal analysis block and a classification block. The input signal is converted to a digital signal with the input processing chain. The digital signal is received by the signal analysis block. Signal information regarding the digital signal is provided from the signal analysis block to the classification block. Classification information is generated with the classification block to classify the digital signal using the signal information provided as being a waveform type selected from of a group of waveform types.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
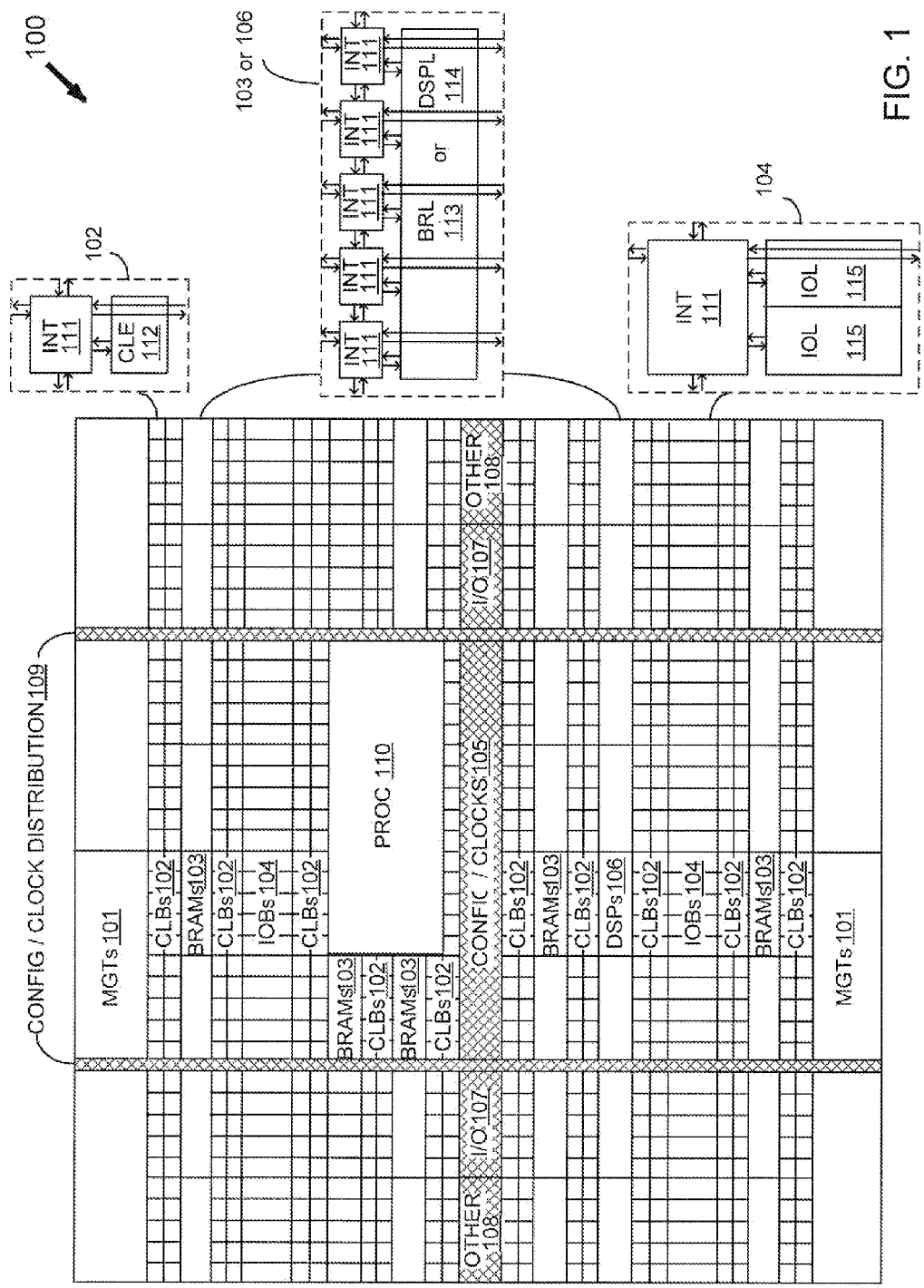
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

In the past, repeaters have not provided differentiation with respect to a type of waveform received for pre-processing for retransmission. However, there are differences between types of waveforms for various air interface protocols, and these differences in effect mean that if all of such waveforms are treated the same, a lesser quality signal may be reproduced by a repeater for retransmission. More recently, a same basestation may be configured to process signals from a plurality of air interface protocols having different waveforms. Along those lines, some basestations may be configured with multi-radio access technology ("multi-RAT"). However, much of the efficiency and/or signal quality of such basestation in processing such various waveforms may be lost if a repeater is used to retransmit signals sent from such a basestation.

As described below, a repeater is configured to adapt to waveform type of an incoming waveform. Such adaptation involves performing a signal analysis on a received signal to obtain signal information thereof, and then use such signal information obtained to classify a waveform received according to a type, such as may be associated with an air interface protocol. Informed by waveform type, parametric input may be selected or generated, such as for crest factor reduction, digital pre-distortion, or other signal processing, which is specific to the waveform type. This allows a repeater to retransmit a higher quality signal, namely a signal that more accurately represents an original transmission from a basestation.

With the above general understanding borne in mind, various configurations for a repeater are generally described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
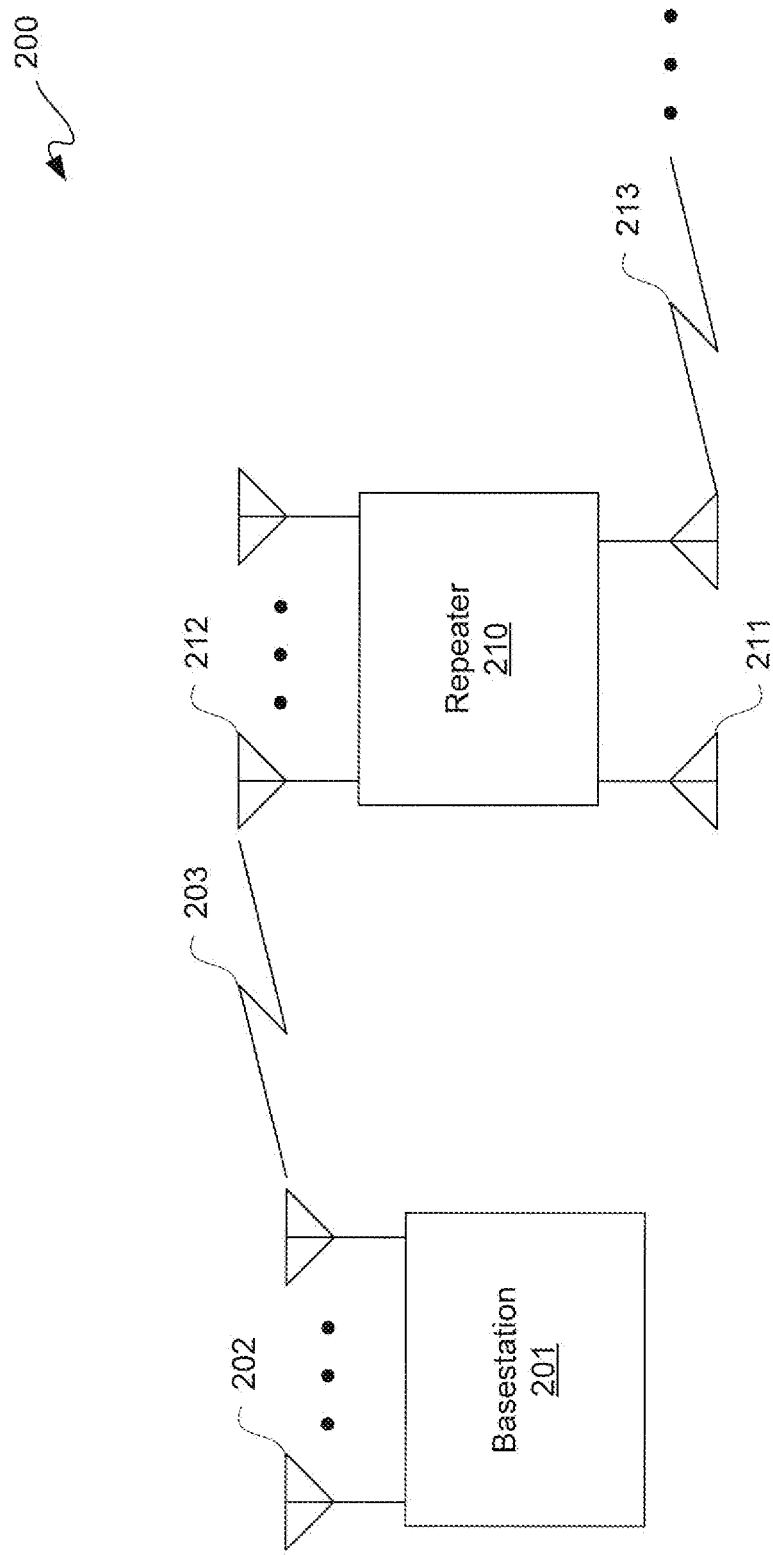
FIG. 2 is a block diagram depicting an exemplary over-the-air ("wireless") communication system.

FIG. 2 is a block diagram depicting an exemplary over-the-air ("wireless") communication system 200. Communication system 200 includes a basestation 201 and a repeater 210. Basestation 201 has one or more transmit antennas 202. Repeater 210 has one or more receive antennas 212 coupled to such one or more transmit antennas 202 through a wireless uplink 203. Repeater 210 is configured to retransmit transmissions sent from basestation 201 to repeater 210 via uplink 203. Repeater 210 may retransmit such transmissions via one or more receive transmit antennas 211 of repeater 210, such as for another wireless uplink 213.

Figure 3:
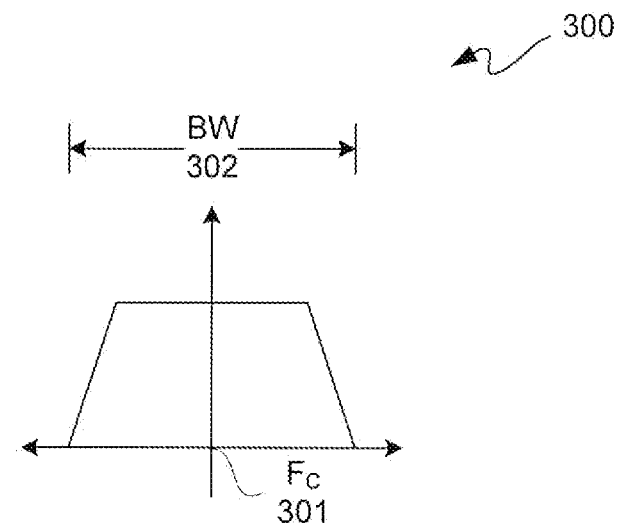
FIG. 3 is a signal diagram depicting an exemplary embodiment of a received signal, such as may be received by the repeater of FIG. 5.

FIG. 3 is a signal diagram depicting an exemplary embodiment of a received signal 300, such as may be received by repeater 210. Some characteristics of received signal 300 may include a signal bandwidth ("BW") 302 and a center frequency ("$F_C$") 301.

Figure 4:
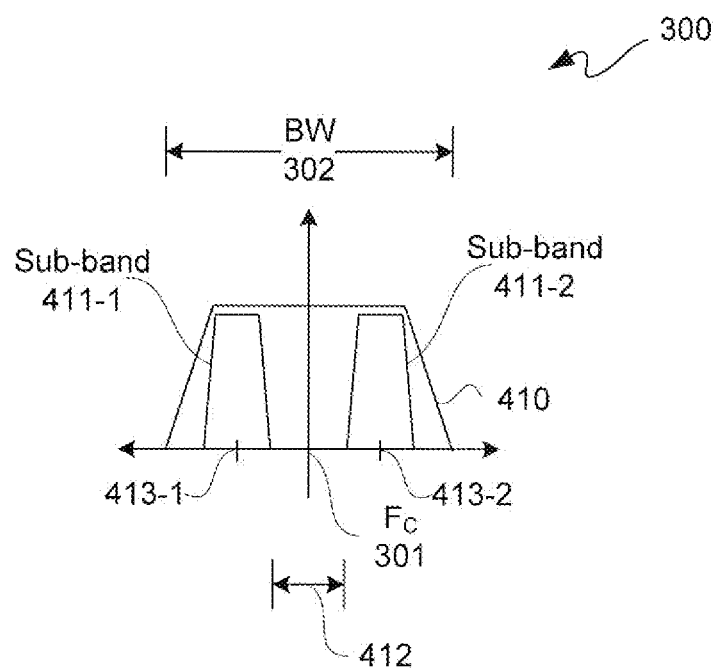
FIG. 4 is a signal diagram depicting an exemplary embodiment of another received signal, such as may be received by the repeater of FIG. 5.

FIG. 4 is a signal diagram depicting an exemplary embodiment of another received signal 300, such as may be received by repeater 210. Some characteristics of this received signal 300 may include a signal bandwidth 302, a center frequency 301, a channel spacing or guard band 412, and one or more sub-bands, such as sub-bands 411-1 and 411-2 within a channel cavity 410. Moreover, sub-bands 411-1 and 411-2 may have their own respective center frequencies 413-1 and 413-2, as well as bandwidths.

Along the above lines of FIGS. 2 through 4, a received signal 300 may have a number of different features depending on the type of signal transmitted. A basestation 201 may be coupled to another basestation and/or to one or more user devices though one or more repeaters 210. Rather than processing all incoming signals the same without any deference with respect to the type of waveform received, repeater 210 is configured to provide some deference to the type of waveform received for pre-processing for retransmission to enhance quality of such retransmitted waveform. However, there may be many types of wireless communication waveforms for a plurality of air interface protocols. Examples of waveform types include OFDM (such as for LTE or WiMax for example), spread spectrum (such as for WCDMA, TD-SCDMA or CDMA2000 for example), frequency hopping or static narrow band signals (such as for frequency hopping or static GSM, respectively, for example), or a combination thereof, among other types of waveforms or other air interface protocols. Thus, to retransmit a received signal 300 with regard to waveform type in order to provide a high-quality retransmission, namely a retransmission of a received signal 300 more closely comporting to an original form of an originally transmitted version of same by a basestation 201, communication waveforms may be analyzed, and then classified in order to provide parametric input to more accurately reproduce such original basestation 201 transmission. This signal analysis may be after conversion to a baseband, and this signal analysis may be used to identify a signal feature vector for providing for classification. Along those lines, a set of signal feature vectors may be extracted from communication waveforms by a signal analysis block, and each vector from such set of signal feature vectors may be provided from such signal analysis block and provided for classification by a classification block.

Figure 5:
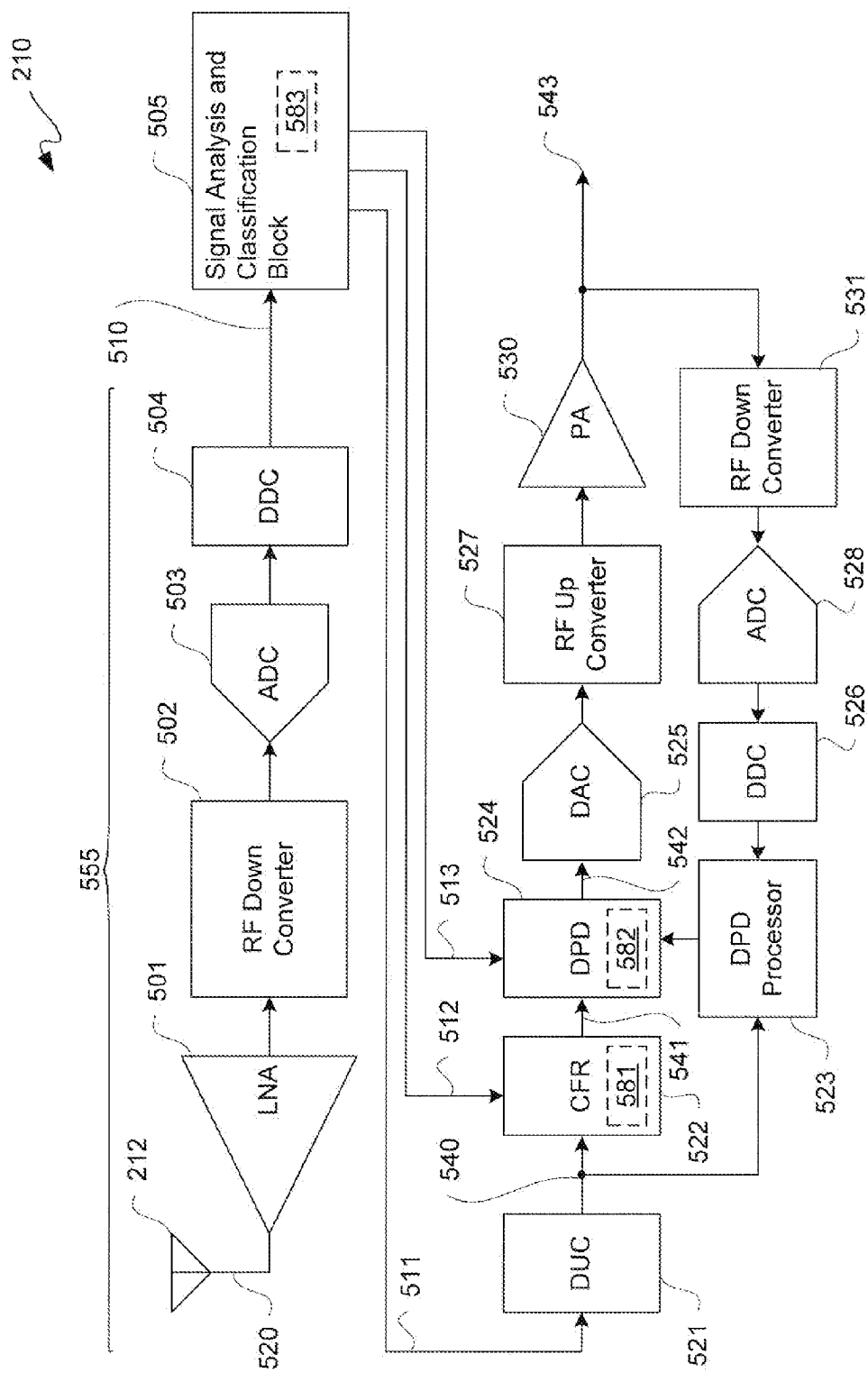
FIG. 5 is a block diagram depicting an exemplary repeater.

To provide such a high-quality retransmission, a repeater 210 capable of identifying input waveform type for selecting and/or generating parametric input corresponding thereto may be used. FIG. 5 is a block diagram depicting an exemplary repeater 210. An over-the-air input signal may be received by receive antenna 212 of repeater 210. Repeater 210, in addition to one or more receive antennas 212 and one or more transmit antennas 211 as in FIG. 2, may further include a low noise amplifier ("LNA") 501, a radio frequency ("RF") down converter 502 for conversion from a transmission frequency down to an intermediate frequency ("IF"), an analog-to-digital converter ("ADC") 503, a digital down converter ("DDC") 504 for conversion down to a baseband frequency ("baseband"), a signal analysis and classification ("SAAC") block 505, a digital up converter ("DUC") 521 for conversion up to an IF, a crest factor reduction ("CFR") block 522, a digital pre-distortion ("DPD") block 524, a DPD processor 523, a digital-to-analog converter ("DAC") 525, an RF up converter 527 for conversion up to a transmission frequency, a DDC 526, a power amplifier ("PA") 530 including a pre-amp, an ADC 528, and an RF down converter 531 for conversion down to an IF. An input processing chain 555, which includes one or more receive antennas 212, LNA 501, RF down converter 502, ADC 503, and optionally DDC 504, may be conventional. Accordingly, it should be appreciated that prior to delivery to an SAAC block 505, an input signal may be a down converted to baseband signal and may be digititzed prior to input to SAAC block 505. However, in another configuration, a down conversion and/or digitization, including without limitation for example a portion of a spectrum of interest, may be performed by SAAC block 505.

Figure 6:
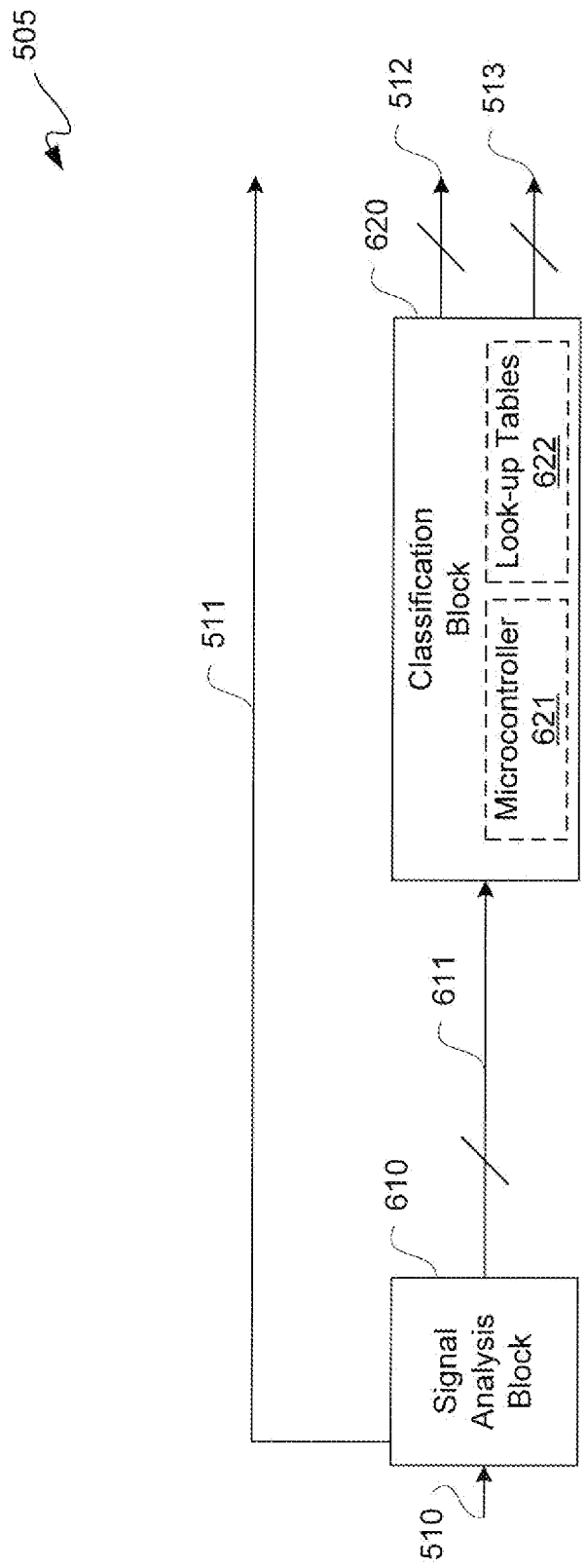
FIG. 6 is a block diagram depicting an exemplary signal analysis and classification block 505.

FIG. 6 is a block diagram depicting an exemplary SAAC block 505. SAAC block 505 includes a signal analysis block 610 and classification block 620. In an example, signal analysis block 610 may be configured as a spectral analysis block. With simultaneous reference to FIGS. 5 and 6, repeater 210, including SAAC block 505, are further described.

At least one receive antenna 212 of repeater 210 receives an over-the-air input signal 520 for amplification by LNA 501. LNA 501 provides an amplified signal to RF down converter 502 for conversion from a transmission frequency down to an IF. RF down converter 502 provides such amplified signal at an IF as an analog input to ADC 503 for conversion to a digital signal. A DDC 504 may be coupled to ADC 503 to convert such digital signal to a baseband. Whether from ADC 503 directly or from DDC 504, a digital signal 510, which is a digital version of a received over-the-air input signal 520, may be provided as an input to SAAC block 505.

Signal analysis block 610 may be coupled to receive digital signal 510. Signal analysis block 610 may be coupled to provide signal information, such as spectral information or other signal information for example, regarding digital signal 510. Spectral analysis block 610 may be configured to provide a decomposed signal 511 as a separate output with spectral information output 611.

Decomposed signal 511 may be a per channel decomposition of digital signal 510. Decomposed signal 511 may be provided as an input to DUO 521 to recompose or reconstitute digital signal 510 therefrom, as well as to up-convert such recomposed digital signal, namely to provide an IF version of digital signal 510 from decomposed signal 511 which is recomposed signal 540. This presumes that spectral analysis block 610 performs some degree of destructive testing on digital signal 510. However, in another configuration, a non-destructive implementation may be provided using parallel signal paths for digital signal 510.

Classification block 620 may be coupled to receive signal information output 611 from signal analysis block 610. Classification block 620 may be configured to classify digital signal 510 using signal information provided from signal information output 611. Such classification may pertain to digital signal 510 being a waveform type of a group of waveform types. A group of waveform types may consist of orthogonal frequency division multiplexed signals, spread spectrum signals, frequency hopping band signals, static narrow band signals, and combinations thereof.

Examples of signal information that signal analysis block 610 may be configured to provide may include: occupancy information of a band of digital signal 510; a center frequency or center frequencies of digital signal 510; a bandwidth or bandwidths of digital signal 510; a carrier frequency or carrier frequencies of digital signal 510; and/or a channel spacing or channel spacings of digital signal 510, among other specific discriminating features associated with use of a spectrum that may be used for classification. Occupancy information for example may include occupancy statistics of a band indicating whether two or more sub-bands are present in such band.

Classification block 620 may be configured to detect pattern or structure of a waveform from signal information. For example, classification block 620 may be configured to generate cyclostatic- or cyclostationary-based classification information, where such cyclostationary-based classification information may include a cyclic autocorrelation function ("CAF"), a cycle frequency or cycle frequencies, and/or symbol timing recovery information generated using signal information provided thereto. Along those lines, classification block 620 may be configured to perform cyclostationary operations. Additional details in waveform classification may be found in "Second-order cyclostationary of mobile WiMAX and LTE OFDM signals and application to spectrum awareness in cognitive radio systems," by A. Al-Habashna, O. A. Dobre, R. Venkatesan and D. C. Popescu, published in IEEE J. of Selected topics in signal processing, Vol. 6, No. 1 Feb. 2012, pp. 26-42, for classification of LTE OFDM signals. Other operations that may be performed may be for identifying and classifying CDMA signals, such as in "A detection method of WCDMA signal based on quadratic fourth-order moment chip at lower SNR", by P. Junjie and Z. Zhijin, Wireless Communications, Networking and Mobile Computing, 2009, WiCom '09. As there are many types of waveforms for various over-the-air protocols, a complete list of all possible waveform operations is not described herein in unnecessary detail for purposes of clarity and not limitation.

Classification block 620 may include optional look-up tables ("LUTs") 622 for selection of parametric input corresponding to a waveform type determined. Along those lines, classification block 620 may generate classification information in response to signal information provided thereto to select parametric information stored in LUTs 622. Optionally, LUTs or other storage may be used and may be distributed in CFR block 522 and/or DPD block 524. In such an optional configuration, classification information generated by classification block 620 may be provided as sideband information to CFR block 522 and/or DPD block 524 for respective look-ups in LUTs in each of those blocks. However, for clarity, it shall be assumed that LUTs 622 are included in classification block 620.

CFR block 522 may be coupled to DUG 521 to receive therefrom a recomposed signal 540, as previously described. Recomposed signal 540 may additionally be provided as an input to a DPD processor 523. DPD block 524 may be coupled to CFR block 522 to receive therefrom a crest factor reduced version of recomposed signal 540, namely crest factor reduced signal 541. DPD block 524 may be configured to digitally pre-distort CFR signal 541 to provide a digitally pre-distorted signal 542 as an input to DAC 525. DAC 525 may convert digitally pre-distorted signal 542 to an analog signal for input to RF up converter 527 to up convert such analog signal from an IF to a transmission frequency for input to PA 530. PA 530 may output a to be transmitted signal 543 coupled to one or more transmit antennas 211 of FIG. 2 for retransmission of over-the-air input signal 520 after processing by repeater 210. Such processing may be enhanced by providing parametric input corresponding to waveform type in order to provide a high quality reproduction of an original version of over-the-air input signal 520 for such retransmission.

Such to be transmitted signal 543 may be provided to a transmitter end (not shown for purposes of clarity) for transmission via one or more transmit antennas 211, and to an RF down converter 531 for conversion from a transmission frequency down to an IF frequency along a feedback path of repeater 210. Output of RF down converter 531 may be provided to ADC 528 for conversion from an analog signal to a digital signal. Output of ADC 528 may be provided to a DDC 526 to convert such digital signal output from ADC 528 from an IF to a baseband. Such baseband digital signal output from DDC 526 may be provided as an input to a DPD processor 523, and DPD processor 523 may likewise be coupled to receive recomposed signal 540. Output of DPD processor 523 may be provided as another input to DPD block 524. DPD processor 523 may be for a feedback loop for adaptation to output of PA 530.

Classification block 620 may be coupled to CFR block 522 to provide thereto CFR parametric input via parametric input signal 512. Such CFR parametric input may include CFR parameters stored in LUTs 622 in association with corresponding waveform types. Optionally, in another implementation, LUTs 622 effectively may be distributed as LUT 581 of CFR block 522 and LUT 582 of CFR block 524, as described below in additional detail. Furthermore, optionally SAAC block 505 may include a processor-based hardware accelerator 583 coupled to receive classification information generated by classification block 620 to generate parametric input for either or both of blocks 522 and 524. However, for purposes of clarity and not limitation, it shall be assumed that LUTs 622 are used.

Classification information generated by classification block 620 may be used to select such CFR parametric input for a waveform type identified. Examples of CFR parametric input that may vary according to waveform type may include a clipping threshold and/or a set of filter coefficients, among other CFR parameters.

Optionally or additionally, classification block 620 may be coupled to DPD block 524 to provide thereto DPD parametric input via parametric input signal 513. Such DPD parametric input may include DPD parameters stored in LUTs 622 in association with corresponding waveform types. CFR and DPD parametric input optionally may be stored together for same waveform types. Classification information generated by classification block 620 may be used to select such DPD parametric input for a waveform type identified. Examples of DPD parametric input that may vary according to waveform type may include a set of filter coefficients, and/or I and Q change values, among other DPD parameters.

Classification block 620, as well as signal analysis block 610, may be implemented using programmable resources of FPGA 100 of FIG. 1. However, in other implementations, dedicated resources and/or programmable resources may be used, whether of an FPGA, ASIC, ASSP or other type of IC. However, for purposes of clarity and not limitation, it shall be assumed that an FPGA implementation is used.

Optionally, classification block 620 may include a microcontroller 621 configured to generate parametric input, whether CFR and/or DPD parametric input, in response to configuration information provided via classification block 620 to provide a more dynamically adaptive system. Along those lines, microcontroller 621 may be a processor-based hardware accelerator coupled to or included in classification block 620 for example to receive cyclostationary-based information and such a processor-based hardware accelerator may be configured to generate parametric input for waveform type responsive to such cyclostationary-based information. Along those lines, such processor-based hardware accelerator may be coupled to CFR block 522 to provide thereto CFR parametric input signal 512 with CFR parameters, or optionally, CFR information for selection of CFR parameters by CFR block 522 may be provided via CFR parametric input signal 512. Likewise, such processor-based hardware accelerator may be coupled to DPD block 524 to provide thereto DPD parametric input signal 513 with DPD parameters, or optionally, DPD information for selection of DPD parameters by DPD block 524 may be provided via DPD parametric input signal 513.

Figure 7:
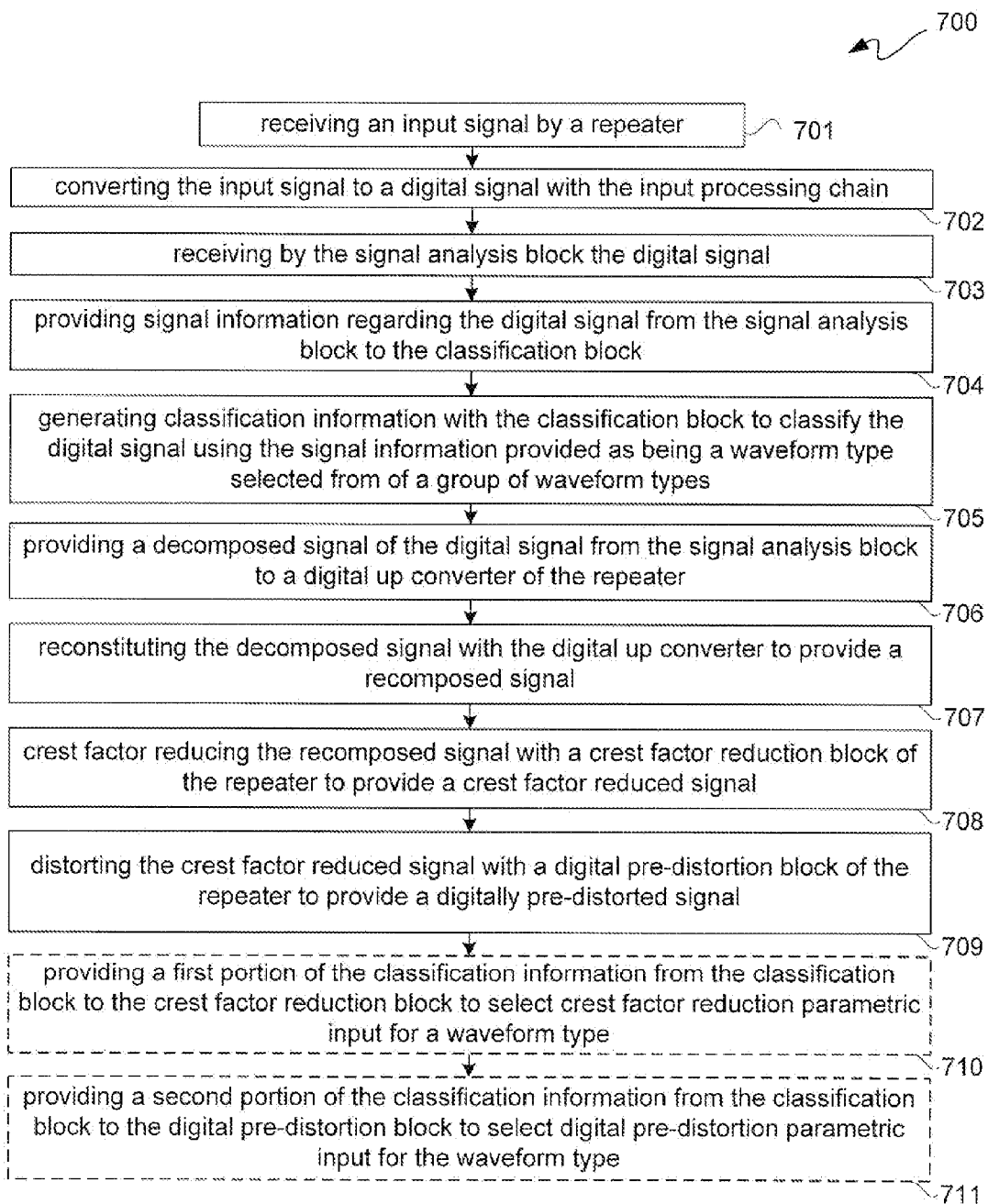
FIG. 7 is a flow diagram depicting an exemplary signal processing flow for the repeater of FIG. 5.

FIG. 7 is a flow diagram depicting an exemplary signal processing flow 700 for a repeater 210 of FIG. 5. Signal processing flow 700 is further described with simultaneous reference to FIGS. 5-7.

At 701, an input signal is received by repeater 210. Repeater 210 may include an input processing chain 555 coupled to a SAAC block 505, where SAAC block 505 may include a signal analysis block 610 and a classification block 620.

At 702, such input signal received at 701 may be converted to a digital signal 510 by input processing chain 555. Signal analysis block 610 receives such digital signal 510 at 703. At 704, signal information may be provided regarding digital signal 510 from signal analysis block 610 to classification block 620. At 705, classification information may be generated with classification block to classify digital signal 510 using signal information provided as being a waveform type selected from of a group of waveform types.

At 706, a decomposed signal 511 of digital signal 510 may be provided from signal analysis block 610 to a digital up converter 521 of repeater 210. At 707, decomposed signal 511 may be reconstituted with digital up converter 521 to provide a recomposed signal 540. At 708, recomposed signal 540 may be crest factor reduced with a CFR block 522 of repeater 210 to provide a crest factor reduced version of recomposed signal 540, namely crest factor reduced signal 541. At 709, crest factor reduced signal 541 may be distorted with a DPD block 524 of repeater 210 to provide a digitally pre-distorted signal 542.

Optionally, at 710 a first portion of classification information generated at 705 by classification block 620 may be provided to CFR block 522 to select crest factor reduction parametric input for a waveform type identified for an input signal received or otherwise obtained at 701. Along those lines, CFR block 522 may optionally include a LUT 581 having stored therein parametric inputs to parameterize CFR block 522 for such waveform type to enhance quality of crest factor reduced signal 541. Such parametric inputs may be associated with corresponding waveform types as stored in LUT 581.

Optionally, at 711 a second portion of classification information generated at 705 by classification block 620 may be provided to DPD block 524 to digital pre-distortion parametric input for such a waveform type identified. Along those lines, DPD block 524 may optionally include a LUT 582 having stored therein parametric inputs to parameterize DPD block 524 for such waveform type to enhance quality of digitally pre-distorted signal 542. Such parametric inputs may be associated with corresponding waveform types as stored in LUT 582.

Such parametric inputs respectively provided to CFR block 522 and DPD block 524 may be to parameterize such blocks for an identified waveform type of a received input signal to specifically enhance quality of signals 540 and 541 respectively output from such blocks. More generally, one or more of such parametric inputs may enhance overall quality of a retransmission by repeater 210 by retransmission of a more accurate replica of an original version of such input signal.

Figure 8:
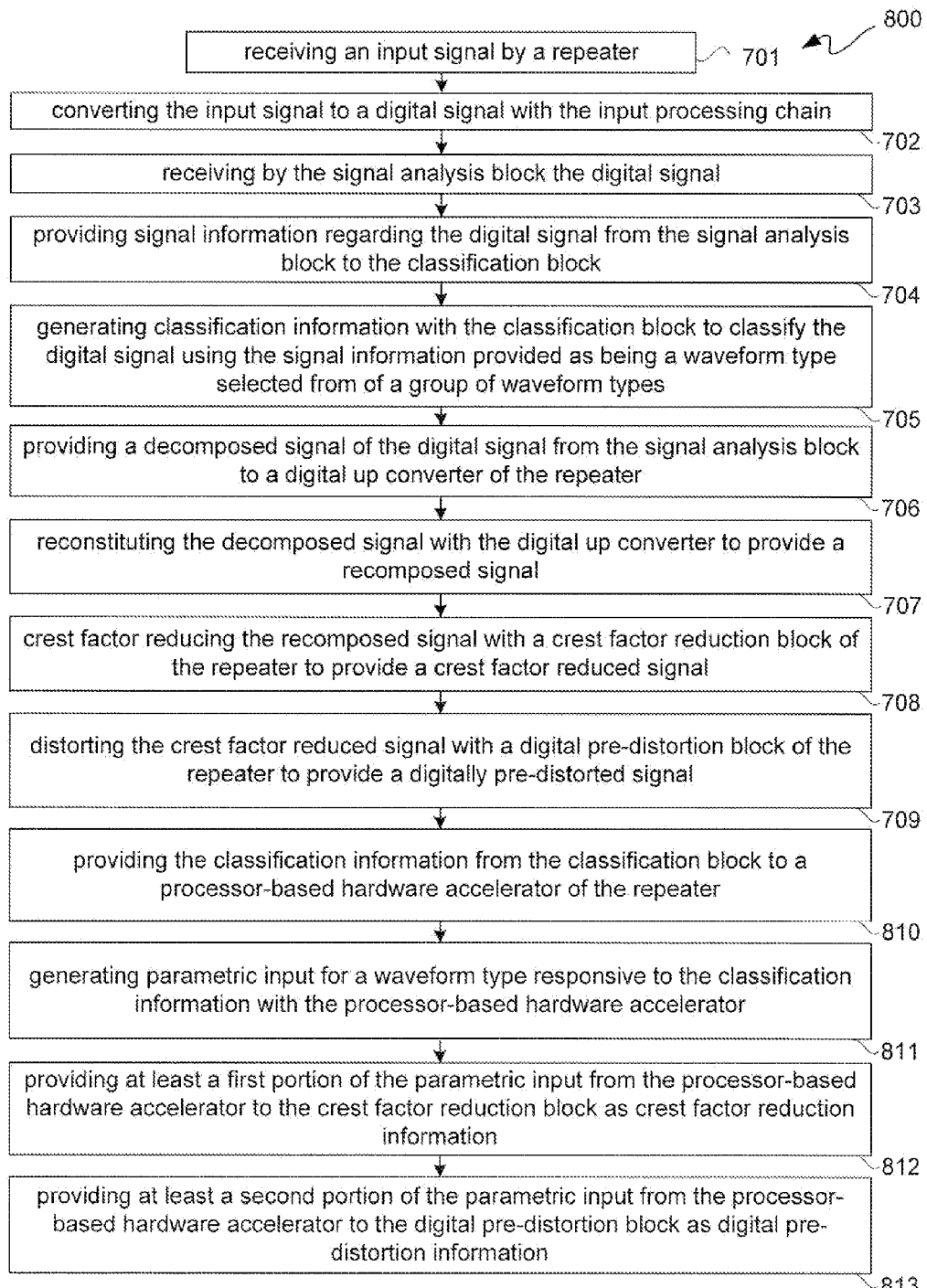
FIG. 8 is a flow diagram depicting another exemplary signal processing flow for the repeater of FIG. 5.

FIG. 8 is a flow diagram depicting another exemplary signal processing flow 800 for a repeater 210 of FIG. 5. Signal processing flow 800 is further described with simultaneous reference to FIGS. 5, 6, and 8. As operations at 701 through 709 are the same as previously described with reference to FIG. 7, such description is not repeated.

At 810, classification information generated at 705 by classification block 620 may be provided to an optional processor-based hardware accelerator 583 of repeater 210, which optional processor-based hardware accelerator 583 may be part of SAAC 505. At 811, parametric input for a waveform type may be generated with processor-based hardware accelerator 583 responsive to classification information provided to such processor-based hardware accelerator 583. At 812, at least a portion of such parametric input may be provided from processor-based hardware accelerator 583 to CFR block 522 as crest factor reduction information. At 813, at least another portion of such parametric input may be provided from processor-based hardware accelerator 583 to DPD block 524 as digital pre-distortion information.

Again, such parametric inputs provided to CFR block 522 and DPD block 524 may be to parameterize such blocks for an identified waveform type of a received input signal to specifically enhance quality of signals 540 and 541 respectively output from such blocks; however, more generally, one or more of such parametric inputs may enhance overall quality of a retransmission by repeater 210 by retransmission of a truer replica of an original version of such input signal. Such parametric inputs respectively provided to CFR block 522 and DPD block 524 may be to parameterize such blocks for an identified waveform type of a received input signal to specifically enhance quality of signals 540 and 541 respectively output from such blocks. More generally, one or more of such parametric inputs may enhance overall quality of a retransmission by repeater 210 by retransmission of a more accurate replica of an original version of such input signal.

While foregoing describes exemplary apparatus(es) and/or method(s), other and further examples in accordance with one or more aspects described herein may be devised without departing from scope hereof, which may be determined by claims that follow and equivalents thereof. Claims listing steps do not imply any order of steps. Trademarks are property of their respective owners.

What may be claimed may be:
1. An apparatus, comprising:
   a repeater having a signal analysis and classification block;
   wherein the signal analysis and classification block comprises a signal analysis block and a classification block;
   wherein the signal analysis block is coupled to receive a digital signal which is a digital version of an input signal received by the repeater;
   wherein the signal analysis block is coupled to provide signal information regarding the digital signal to the classification block;
   wherein the classification block is configured to provide classification information to classify the digital signal using the signal information provided as being a waveform type of a group of waveform types;
wherein the repeater has a digital up converter coupled to the signal analysis block; and
wherein the signal analysis block is coupled to provide a decomposed signal of the digital signal to the digital up converter.

2. The apparatus according to claim 1, wherein the signal information includes occupancy information of a band of the digital signal.

3. The apparatus according to claim 1, wherein the signal information includes a center frequency of the digital signal.

4. The apparatus according to claim 1, wherein the signal information includes a bandwidth of the digital signal.

5. The apparatus according to claim 1, wherein the signal information includes a carrier frequency of the digital signal.

6. The apparatus according to claim 1, wherein the signal information includes a channel spacing of the digital signal.

7. The apparatus according to claim 1, wherein:
the repeater has a crest factor reduction block and a digital pre-distortion block;
the signal analysis block is a spectral analysis block;
the crest factor reduction block is coupled to the digital up converter to receive therefrom a recomposed signal based on an up-converted version of the decomposed signal; and
the digital pre-distortion block is coupled to the crest factor reduction block to receive therefrom a crest factor reduced version of the recomposed signal.

8. The apparatus according to claim 7, wherein the classification block is coupled to the crest factor reduction block to provide thereto the classification information to select crest factor reduction parametric input for the waveform type for use by the crest factor reduction block.

9. The apparatus according to claim 7, wherein the classification block is coupled to the digital pre-distortion block to provide thereto the classification information to select digital pre-distortion parametric input for the waveform type for use by the digital pre-distortion block.

10. The apparatus according to claim 7, wherein the classification information includes cyclostationary-based information.

11. The apparatus according to claim 1, wherein the cyclostationary-based information is selected from a group consisting of cyclic autocorrelation information, cycle frequencies, and symbol timing recovery information.

12. The apparatus according to claim 10, wherein:
the repeater has a processor-based hardware accelerator coupled to the classification block to receive the cyclostationary-based information; and
the processor-based hardware accelerator is configured to generate parametric input for the waveform type responsive to the cyclostationary-based information.

13. The apparatus according to claim 10, wherein the processor-based hardware accelerator is coupled to the crest factor reduction block to provide thereto crest factor reduction information for the parametric input.

14. The apparatus according to claim 12, wherein the processor-based hardware accelerator is coupled to the digital pre-distortion block to provide thereto digital pre-distortion information for the parametric input.

15. The apparatus according to claim 12, wherein the group of waveform types consists of orthogonal frequency division multiplexed signals, spread spectrum signals, frequency hopping band signals, static narrow band signals, and combinations thereof.

16. A method, comprising:
receiving an input signal by a repeater;
wherein the repeater comprises an input processing chain coupled to a signal analysis and classification block;
wherein the signal analysis and classification block comprises a signal analysis block and a classification block;
converting the input signal to a digital signal with the input processing chain;
receiving by the signal analysis block the digital signal;
providing signal information regarding the digital signal from the signal analysis block to the classification block;
generating classification information with the classification block to classify the digital signal using the signal information provided as being a waveform type selected from of a group of waveform types; and
providing a decomposed signal of the digital signal from the signal analysis block to a digital up converter of the repeater.

17. The method according to claim 16, further comprising:
reconstituting the decomposed signal with the digital up converter to provide a recomposed signal;
crest factor reducing the recomposed signal with a crest factor reduction block of the repeater to provide a crest factor reduced signal;
distorting the crest factor reduced signal with a digital pre-distortion block of the repeater to provide a digitally pre-distorted signal;
providing a first portion of the classification information from the classification block to the crest factor reduction block to select crest factor reduction parametric input for the waveform type; and
providing a second portion of the classification information from the classification block to the digital pre-distortion block to select digital pre-distortion parametric input for the waveform type.

18. The method according to claim 16, further comprising:
reconstituting the decomposed signal with the digital up converter to provide a recomposed signal;
crest factor reducing the recomposed signal with a crest factor reduction block of the repeater to provide a crest factor reduced signal;
distorting the crest factor reduced signal with a digital pre-distortion block of the repeater to provide a digitally pre-distorted signal;
providing the classification information from the classification block to a processor-based hardware accelerator of the repeater;
generating parametric input for the waveform type responsive to the classification information with the processor-based hardware accelerator; and
providing the parametric input from the processor-based hardware accelerator to the crest factor reduction block as crest factor reduction information.

19. The method according to claim 16, further comprising:
reconstituting the decomposed signal with the digital up converter to provide a recomposed signal;
crest factor reducing the recomposed signal with a crest factor reduction block of the repeater to provide a crest factor reduced signal;
distorting the crest factor reduced signal with a digital pre-distortion block of the repeater to provide a digitally pre-distorted signal;
providing the classification information from the classification block to a processor-based hardware accelerator of the repeater;

generating parametric input for the waveform type responsive to the classification information with the processor-based hardware accelerator; and providing the parametric input from the processor-based hardware accelerator to the digital pre-distortion block as digital pre-distortion information.

* * * * *